United States Patent [19]
Toyoda

[11] 3,979,614
[45] Sept. 7, 1976

[54] DT CUT, CONTOUR MODE PIEZOELECTRIC CRYSTAL

[75] Inventor: Satoshi Toyoda, Tokyo, Japan

[73] Assignee: Kinsekisha Laboratory, Ltd., Tokyo, Japan

[22] Filed: Oct. 21, 1974

[21] Appl. No.: 516,440

[30] Foreign Application Priority Data
Oct. 24, 1973   Japan.............................. 48-119582

[52] U.S. Cl................................... 310/9.5; 310/9.6
[51] Int. Cl.²......................................... H01L 41/04
[58] Field of Search .................... 310/8, 8.2, 9.5, 9.6

[56] References Cited
UNITED STATES PATENTS

| 2,159,796 | 5/1939 | Hawk............................. 310/9.6 X |
| 2,261,791 | 11/1941 | Bokovoy.............................. 310/9.6 |
| 2,486,916 | 11/1949 | Bottom .............................. 310/9.6 |
| 3,097,315 | 7/1963 | Shinada et al. .................. 310/9.6 X |
| 3,497,732 | 2/1970 | Royer ............................. 310/9.6 X |

OTHER PUBLICATIONS
Handbook of Piezo Xtals, by J. P. Buchanan, WADC Technical Report 54–248, Dec. 1954, pp. 35–45.
Piezoelectricity, by W. G. Cady, Dover Publications, 1964, pp. 451–460.

Primary Examiner—Mark O. Budd
Attorney, Agent, or Firm—Charles E. Pfund

[57] ABSTRACT

In a crystal element of the type wherein a DT-cut crystal element is used to generate vibrations of the contour mode, one side of the crystal element is flat and the thickness of the element is gradually decreased from the center toward the periphery thereof.

3 Claims, 4 Drawing Figures

DT CUT, CONTOUR MODE PIEZOELECTRIC CRYSTAL

BACKGROUND OF THE INVENTION

This invention relates to the improvement of a crystal element, more particularly to a crystal element utilizing a DT-cut quartz crystal for providing vibrations of the contour mode.

It is well known in the art to use a DT-cut crystal element for producing a fundamental wave vibration in a relatively low frequency band of from about 100 to 300 KHz and to use a CT-cut crystal element for producing a fundamental wave vibration in a relatively high frequency band of from about 300 to 600 KHz. The frequency constants produced by said two types of crystal elements generally have the following values. More particularly, with a DT-cut crystal element made of a square quartz plate, a frequency constant of 2080 KHz·mm is produced which corresponds to the product of the natural frequency and the length (in mm) of one side of the square. In the case of a circular disc, the frequency constant is expressed by the product of the natural frequency and the diameter (in mm) of the disc, that is 2480 KHz·mm. In the case of the CT-cut, where a square crystal element is used, a frequency constant of 3090 KHz·mm is obtained, whereas (when a circular disc crystal element is used) a frequency constant of 3780 KHz is obtained. In this manner, the CT-cut crystal element is superior to the DT-cut crystal element in frequency characteristics but the DT-cut crystal element has better frequency-temperature characteristic. For this reason it will be very advantageous if the operating frequency range of the DT-cut crystal element can be widened to that of the CT-cut crystal element by modifying the orientation of the cut.

The frequency of a crystal element for producing a contour mode vibration is generally determined by the orientation of the cutting angle with respect to the axis of crystallization and the contour dimension of the crystal element, and the frequency is not related to the thickness of the crystal element, so that the orientation of the cutting angle is firstly determined to be the CT cut or DT cut thus determining the frequency constant, and then the contour dimension corresponding to the desired frequency is determined by utilizing the frequency constant. Therefore, the thickness of the crystal element has been made to be independent of the frequency. For this reason, convexed element was utilized for crystal elements operating at a thickness shear mode vibration alone and not for crystal elements operating with a contour mode vibration.

SUMMARY OF THE INVENTION

Accordingly, it is an object of this invention to provide a DT-cut crystal element having the temperature characteristic of a DT-cut crystal element and being capable of expanding the frequency characteristic of said element to that of a CT-cut crystal element.

An improved DT-cut crystal element characterizing this invention is shown in FIG. 1. According to this embodiment, the crystal element 1 having a circular shape is formed with DT-cut angle. Said crystal element has the upper and lower surfaces which are convexed. The thickness of said element 1 is gradually decreased from the center toward the periphery thereof. Electrodes 2 and 3 are applied onto the upper and lower surfaces by vapour deposition technique or spattering process. Supporting and power supply conductors 4 and 5 are connected to the center of said electrodes 2 and 3.

According to one aspect of this invention, there is provided a crystal element of the class wherein said element is used to generate vibrations of the contour mode, characterized in that said element is orientated in DT-cutting angle with respect to the axis of a crystal which is selected as a raw material of said element, and that said element is formed in a circular shape, having convexed surfaces or a bevelled large portion at the periphery thereof, whereby the frequency band of said element being expanded to that of CT-cut element.

According to another aspect of this invention, there is provided a crystal element of the class wherein a DT-cut crystal element is used to generate vibrations of the contour mode, characterized in that one side of the crystal element is flat and that the thickness thereof is gradually decreased from the center toward the periphery thereof.

Preferably, the other side is convexed with a predetermined radius of curvature. The flat side is easy to work and can be used for readily determining the orientation of the cutting angle with respect to the axis of crystallization of the crystal.

BRIEF DESCRIPTION OF THE DRAWING

Further objects and advantages of the invention can be more fully understood from the following detailed description taken in conjunction with the accompanying drawing in which.

DESCRIPTION OF THE PREFERRED EMBODIMENT

Figure 1:
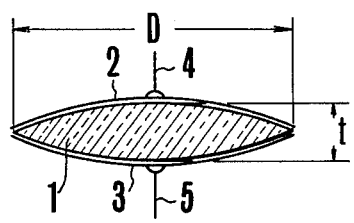
FIG. 1 shows a diagrammatic cross-sectional side view of a crystal element having convexed surfaces on both sides embodying the invention.
Figure 2:
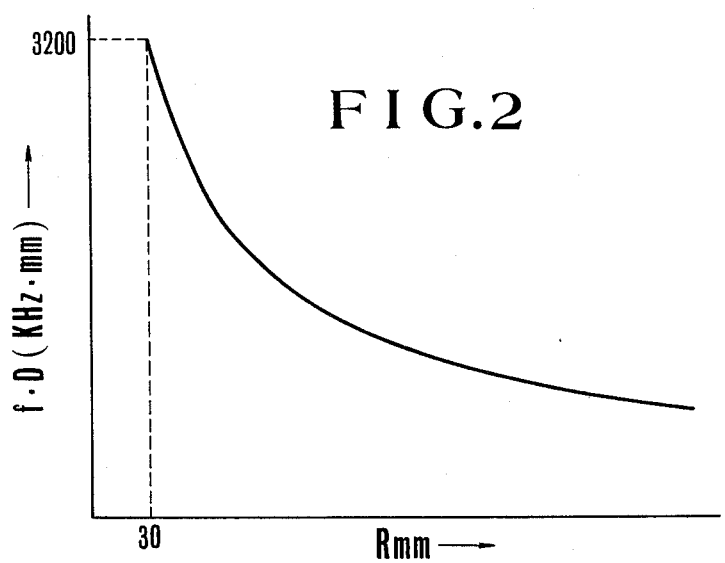
FIGS. 2 and 3 are graphs showing the frequency and temperature characteristics of the crystal element shown in FIG. 1
Figure 3:
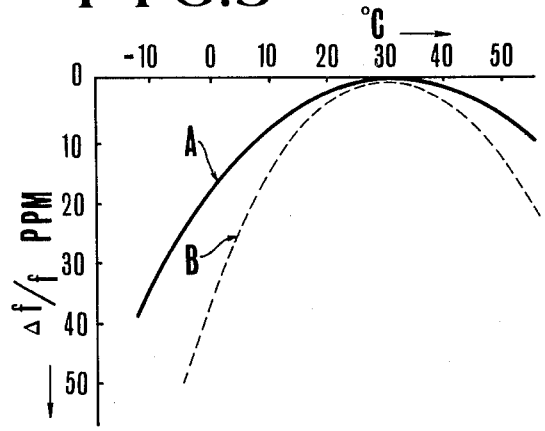

An improved crystal element is shown in FIG. 1. According to this embodiment, the upper and lower surfaces of the crystal element 1 are convexed and electrodes 2 and 3 are applied onto the convex surfaces by vapour deposition technique or spattering process. Supporting and power supply conductors 4 and 5 are connected to thwe center of the electrodes 2 and 3 by soldering or welding. A series resonance frequency and a series resonance resistance were measured by varying the radius of curvature of a crystal element constructed as above described and having a diameter D of 9.43 mm and a maximum thickness $t$ of 0.8 mm and obtained a characteristic as shown in FIG. 2 in which the ordinate represents the frequency constant which is equal to the product of the diameter D in mm and the natural frequency $f$ in KHz and the abscissa represents the radius of curvature R in mm. As can be noted from the graph shown in FIG. 2, the frequency constant increases as the radius of curvature decreases, and a frequency constant of about 3200 KHz·mm is obtained for a radius of curvature of 30 mm. This frequency constant is larger than the frequency constant 2080 KHz·mm of a square plate crystal element, and is also larger than 3090 KHz·mm of a CT-cut crystal element of the same shape. On the other hand, the series resonance resistance decreases as the radius of curvature R decreases. The measured frequency-temperature characteristic of a DT-cut crystal element having a construction as shown in FIG. 1 is represented by a solid line A shown in FIG. 3 which is superior to the frequency-temperature characteristic of a CT-cut crystal element shown by a dotted line B. In other words, a DT-cut crystal element shown in FIG. 1 has a frequency-temperature characteristic inherent to a prior art DT-cut crystal element shaped in square plate. In this manner, when the opposite surfaces of a crystal element are convexed according to a predetermined radius of curvature, it is possible to stably operate a DT-cut crystal element in the frequency range of a CT-cut crystal element without degrading the frequency-temperature characteristic of the former.

Figure 4:
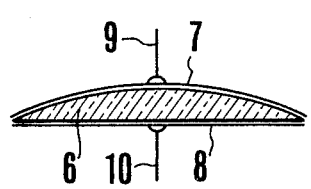
FIG. 4 is a diagrammatic cross-sectional side view showing another embodiment of a crystal element embodying the invention.

FIG. 4 shows another embodiment of this invention. According to this embodiment, more simplified working for providing a crystal element can be realized since a complicated working due to the dual convexed surfaces preparation can be eliminated and the difficulties of determination of the cutting angle due to the dual convexed surfaces construction can also be removed out.

As shown in FIG. 4, the crystal element 6 is of the DT-cut type having a flat surface on one side and a convexed surface of a predetermined radius of curvature on the opposite sides. Electrodes 7 and 8 are deposited on these surfaces by vacuum vapour deposition technique, for example, and support and power supply conductors 9 and 10 are electrically connected to the center of electrodes 9 and 10. The frequency constant of this crystal element 6 was measured to be approximately 3140 KHz·mm. Although the crystal element 6 is of the DT-cut type, it is possible to use it in the frequency range of the CT-cut crystal element whereby a crystal element having an excellent frequency-temperature characteristic which is a feature of a prior DT-cut crystal element shaped in square plate. Since one side of the crystal element is flat it can be worked extremely readily. Further, after working this flat side it is possible to readily measure the orientation of the cutting angle of the crystal element with respect to the axis of crystallization thereof by utilizing the flat surface as a reference plane.

What is claimed is:

1. In a crystal element wherein said crystal element is formed with DT-cut angle in a circular shape for generating vibrations in the contour mode, characterized in that the thickness of said crystal element is gradually decreased from the center toward the periphery thereof, electrodes being applied to the surfaces of said element opposed to each other, supporting and power conductors being connected to the center of said electrodes.

2. The crystal element according to claim 1 wherein two surfaces of said element are convexed.

3. The crystal element according to claim 1 wherein one side of said crystal element is convexed and the other side thereof is flat.

* * * * *